(12) United States Patent
Khoury et al.

(10) Patent No.: US 6,420,884 B1
(45) Date of Patent: Jul. 16, 2002

(54) CONTACT STRUCTURE FORMED BY PHOTOLITHOGRAPHY PROCESS

(75) Inventors: Theodore A. Khoury, Chicago; Mark R. Jones, Mundelein; James W. Frame, Chicago, all of IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/240,442

(22) Filed: Jan. 29, 1999

(51) Int. Cl.⁷ ............................................. G01R 31/02
(52) U.S. Cl. ..................... 324/754; 324/761; 324/762
(58) Field of Search ................................ 324/754, 755, 324/760, 761, 762, 158.1, 73.1, 72.5; 439/482

(56) References Cited

U.S. PATENT DOCUMENTS

| | | | |
|---|---|---|---|
| 4,567,433 A | * | 1/1986 | Ohkubo et al. ............. 324/762 |
| 5,355,080 A | * | 10/1994 | Sato et al. .................. 324/761 |
| 5,513,430 A | | 5/1996 | Yanof et al. |
| 5,557,214 A | | 9/1996 | Barnett |
| 5,621,333 A | | 4/1997 | Lang et al. |
| 5,670,889 A | * | 9/1997 | Okubo et al. ............... 324/760 |
| 6,043,563 A | | 3/2000 | Eldridge et al. |

* cited by examiner

Primary Examiner—Ernest Karlsen
Assistant Examiner—Minh Tang
(74) Attorney, Agent, or Firm—Muramatsu & Associates

(57) ABSTRACT

A contact structure for testing a semiconductor wafer, a packaged LSI or a printed circuit board is formed of contact beams and a contact substrate. The contact beam is configured by a silicon base having an inclined support portion created through an anisotropic etching process, an insulation layer having a planar shape and formed on the silicon base and projected from the inclined support, and a conductive layer having a planar shape and made of conductive material formed on one surface of the insulation layer so that a beam portion is created by the insulation layer and the conductive layer. The insulation layer and the conductive layer have substantially the same length. The beam portion exhibits a spring force in a transversal direction of the beam portion to establish a contact force when the tip of the beam portion pressed against a contact target.

7 Claims, 14 Drawing Sheets

Fig.3 (Prior Art)
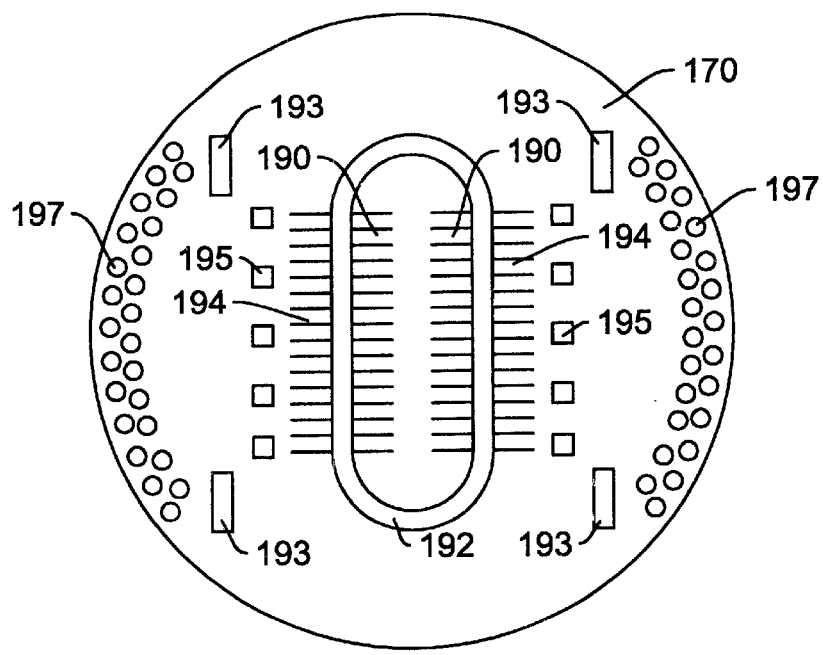
Fig. 4A
(Prior Art)
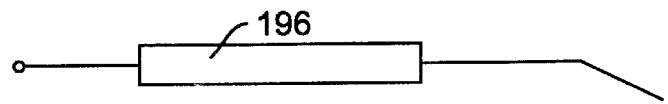
Fig. 4B
(Prior Art)
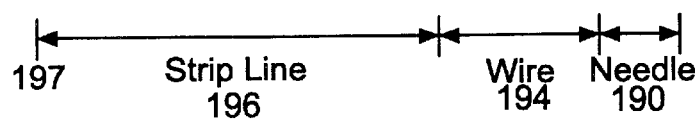
Fig. 4C
(Prior Art)
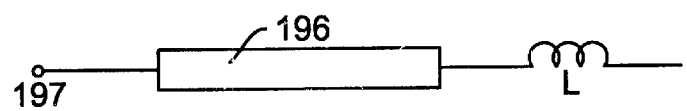
Fig. 4D
(Prior Art)
Fig. 4E
(Prior Art)
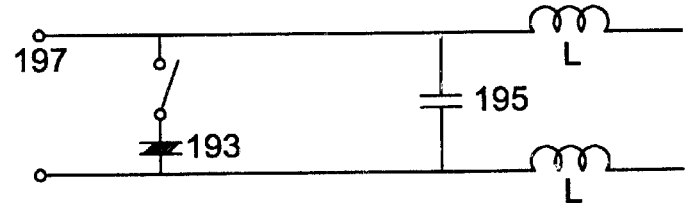

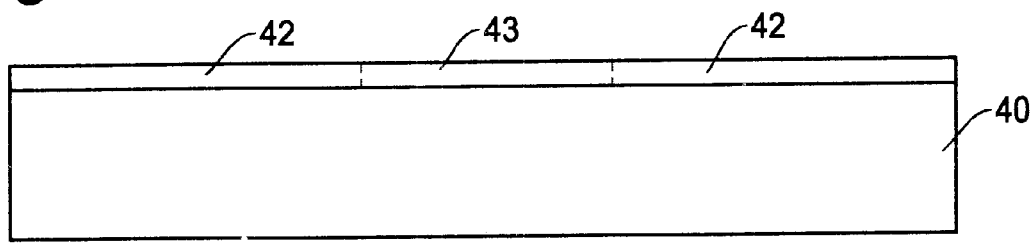
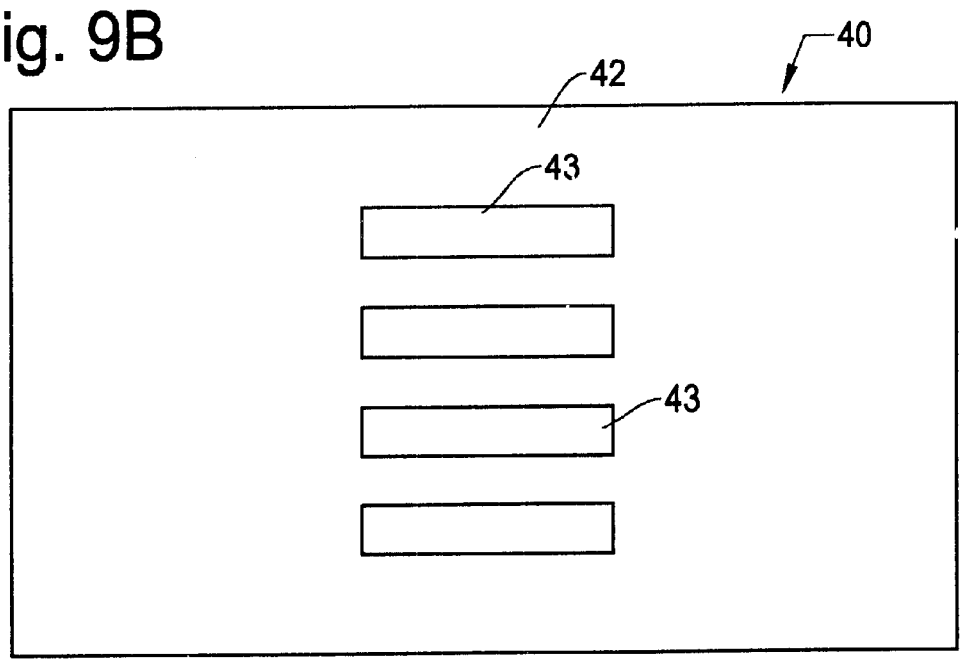

CONTACT STRUCTURE FORMED BY PHOTOLITHOGRAPHY PROCESS

FIELD OF THE INVENTION

This invention relates to contact structures to establish electrical contact with contact targets such as pads, electrode, or leads of electronic circuits or devices, and more particularly, to contact structures to be used such as in a probe card to test semiconductor wafers, packaged semiconductor devices, IC chips, printed circuit boards and the like, with an higher speed, frequency range, density and quality.

BACKGROUND OF THE INVENTION

In testing high density and high speed electrical devices such as LSI and VLSI circuits, high performance contact structures such as probe contactors must be used. The contact structure of the present invention is not limited to the application of testing, including burn-in testing, of semiconductor wafers and die, but is inclusive of testing and burn-in of packaged semiconductor devices, printed circuit boards and the like. However, for the convenience of explanation, the present invention is described mainly with reference to the semiconductor wafer testing.

In the case where semiconductor devices to be tested are in the form of a semiconductor wafer, a semiconductor test system such as an IC tester is usually accompanied with a substrate handler, 400 such as an automatic wafer prober, to automatically test the semiconductor wafer. Such an example is shown in FIG. 1 in which a semiconductor test system has a test head 600 which is ordinarily in a separate housing and is electrically connected to the main frame of the test system with a bundle of cables. The test head and the substrate handler are mechanically and electrically interacted with one another by means of a manipulator 500 driven by a motor 510 and the semiconductor wafers to be tested are automatically provided to a test position of the test head by the substrate handler.

On the test head, the semiconductor wafer to be tested is provided with test signals generated by the semiconductor test system. The resultant output signals from IC circuits on the semiconductor wafer under test are transmitted to the semiconductor test system wherein they are compared with expected data to determine whether the IC circuits on the semiconductor wafer function correctly.

The test head and the substrate handler are connected with an interface component 140 consisting of a performance board 120 which is a printed circuit board having electric circuit connections unique to a test head's electrical footprint, coaxial cables, pogo-pins and connectors. The test head 600 includes a large number of printed circuit boards 150 which correspond to the number of test channels or test pins. Each of the printed circuit boards has a connector 160 to receive a corresponding contact terminal 121 of the performance board 620. A "frog" ring 130 is mounted on the performance board 620 to accurately determine the contact position relative to the substrate handler 400. The frog ring 130 has a large number of contact pins 141, such as ZIF connectors or pogo-pins, connected to contact terminals 121, through coaxial cables 124.

FIG. 2 shows, in more detail, a structure of the substrate handler (wafer prober) 400, the test head 600 and the interface component 140 when testing a semiconductor wafer. As shown in FIG. 2, the test head 600 is placed over the substrate handler 400 and mechanically and electrically connected to the substrate handler through the interface component 140. In the substrate handler 400, a semiconductor wafer 300 to be tested is mounted on a chuck 180. A probe card 170 is provided above the semiconductor wafer 300 to be tested. The probe card 170 has a large number of probe contactors or contact structures (such as cantilevers or needles) 190 to contact with circuit terminals or contact targets in the IC circuit of the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 620 with coaxial cables 124 where each contact terminal 121 is connected to the printed circuit board 150 of the test head 600. Further, the printed circuit boards 150 are connected to the semiconductor test system through the cable 110 having several hundreds of inner cables.

Under this arrangement, the probe contactors 190 contact the surface of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the cantilevers 190 contact the pads or bumps on the wafer 300. The ends of the cantilevers 190 are connected to wires 194 which are further connected to transmission lines (not shown) formed in the probe card 170. The transmission lines are connected to a plurality of electrodes 197 which contact the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant of the polyimide, inductances, and capacitances of the signal within the probe card 170. Thus, the signal lines are impedance matched lines to achieve a high frequency transmission bandwidth to the wafer 300 providing current during steady state and high current peaks generated by the device's outputs switching. For removing noise, capacitors 193 and 195 are provided on the probe card between the power and ground planes.

An equivalent circuit of the probe card 170 is shown in FIG. 4 to explain the limitation of bandwidth in the conventional probe card technology. As shown in FIGS. 4A and 4B, the signal transmission line on the probe card 170 extends from the electrode 197, the strip (impedance matched) line 196, the wire 194 and the needle (cantilever) 190. Since the wire 194 and needle 190 are not impedance matched, these portions function as an inductor L in the high frequency band as shown in FIG. 4C. Because of the overall length of the wire 194 and needle 190 is around 20–30mm, the significant frequency limitation is resulted in testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines.

Accordingly, the most widely used probe contactors as noted above are limited to the frequency bandwidth of approximately 200 MHz which is insufficient to test recent semiconductor devices. It is considered, in the industry, that the frequency bandwidth be of at least that equal to the tester's capability which is currently on the order of 1GHz or higher, will be necessary in the near future. Further, it is desired in the industry that a probe card is capable of handling a large number of semiconductor devices, especially memories, such as 32 or more, in parallel (parallel test) to increase test throughput.

A relatively new type of probe card having membrane contactors is expected to have a sufficiently high bandwidth because it can incorporate impedance matched transmission lines to the tips of the contactors. However, membrane contactors have a disadvantage in that they are deformed by the temperature change to a degree that the contact performance is no longer available. Another disadvantage of the membrane contactors resides in that only limited number of contactors can be fabricated on the membrane because of the difficulty of providing spring forces to the contactors. One last disadvantage inherent in the technology is the lack of individual compliance in the contactors relative to one another. If the contacting surface presents anomalies in topology from one point to another (which become more pronounced over a larger area), this variability cannot be accounted for on an individual basis from one contactor to another. Therefore, membrane contactors are not suitable for testing a large number of devices in parallel.

In the conventional technology, the probe card and probe contactors such as shown in FIG. 3 are manually made, resulting in inconsistent quality. Such inconsistent quality includes fluctuations of size, frequency bandwidth, contact force and resistance, etc. In the conventional probe contactors, another factor making the contact performance unreliable is that the probe contactors and the semiconductor wafer under test have different temperature expansion ratios. Thus, under the varying temperature, the contact positions therebetween vary which adversely affects the contact force, contact resistance and bandwidth.

SUMMARY OF THE INVENTION

Therefore, it is an object of the present invention to provide contact structures to be used in testing a semiconductor wafer, packaged LSI and the like which have a very high operating frequency to meet the test requirements in the next generation semiconductor technology.

It is another object of the present invention to provide contact structures to be used in testing a semiconductor wafer, packaged LSI and the like which are suitable for testing a large number of semiconductor devices in a parallel fashion at the same time.

It is a further object of the present invention to provide contact structures to be used in testing a semiconductor wafer, packaged LSI and the like which are produced through a standard semiconductor production process without involving manual assembly or handling, thereby achieving uniform and consistent quality.

It is a further object of the present invention to provide contact structures to be used in testing a semiconductor wafer, packaged LSI and the like, a large number of which can be produced at the same time with uniform and consistent quality.

It is a further object of the present invention to provide contact structures to be used in testing a semiconductor wafer, packaged LSI and the like which are produced through photolithography processes.

It is a further object of the present invention to provide contact structures to be mounted on a probe card for testing a semiconductor wafer, packaged LSI and the like which are capable of compensating temperature expansion coefficient of a semiconductor wafer under test.

In the present invention, a contact structure for testing a semiconductor wafer, a packaged LSI or a printed circuit board (device under test) is formed through a photolithography technology well established in the semiconductor production process and mounted on a surface of the substrate.

The contact structure of the present invention has a beam like shape formed through a photolithography technology. The contact structure is formed of a silicon base having an inclined support portion created through an anisotropic etching process, an insulation layer formed on the silicon base and projected from the inclined support, and a conductive layer made of conductive material formed on the insulation layer so that a beam portion is created by the insulation layer and the conductive layer, where wherein the beam portion exhibits a spring force in a transversal direction of the beam portion to establish a contact force when the tip of the beam portion pressed against a contact target.

Another aspect of the present invention is contact structure mounting a large number of contact beams formed through the photolithography process. The contact structure includes a plurality of contact beams each of which exhibits a spring force in a transversal direction thereof to establish a contact force when the tip of the contact beam pressed against a contact target, where each of the contact beam is comprised of a silicon base having an inclined support portion created through an anisotropic etching process, an insulation layer for electrically insulating the beam portion from one another, and a conductive layer made of conductive material formed on the insulation layer so that a beam portion is created by the insulation layer and the conductive layer, a contact substrate for mounting the plurality of contact beams wherein the contact substrate have grooves for receiving the silicon base therein in a manner to fix the contact beams in a diagonal direction, and a plurality of contact traces provided on a surface of the contact base and respectively connected to the contact beams to establish signal paths toward an electrical component external to the contact substrate.

A further aspect of the present invention is contact structure mounting a large number of contact beams formed through the photolithography process. The contact structure includes a plurality of contact beams each of which exhibits a spring force in a transversal direction thereof to establish a contact force when the tip of the contact beam pressed against a contact target, where each of the contact beam is comprised of a silicon base having two inclined portions at least one of which is created through an anisotropic etching process, an insulation layer for electrically insulating the beam portion from one another, and a conductive layer made of conductive material formed on the insulation layer so that a beam portion is created by the insulation layer and the conductive layer, a contact substrate for mounting the plurality of contact beams wherein the contact substrate have a planar surface for mounting thereon the silicon bases by means of an adhesive to fix the contact beams in a diagonal direction, and a plurality of contact traces provided on a surface of the contact base and respectively connected to the contact beams to establish signal paths toward an electrical component external to the contact substrate.

A further aspect of the present invention is a process for producing the contact structure. The method of producing the contact structure is comprised of the steps of providing a silicon substrate cut in a (100) crystal plane, applying a first photolithography process on an upper surface of the silicon substrate for forming a boron doped layer on a surface of the silicon substrate, forming a first insulation layer on the boron doped layer, forming a second insulation layer on a bottom surface of the silicon substrate, applying a second photolithography process on the second insulation layer for forming an etch window in the second insulation layer, performing an anisotropic etch through the etch window; and applying a third photolithography process on the first insulation layer for forming a conductive layer, where each of the photolithography processes includes steps of photoresist coating, masking, exposure, and photoresist stripping.

According to the present invention, the contactor has a very high frequency bandwidth to meet the test requirements in the next generation semiconductor technology. Since the probe contactor is formed through a modern miniaturization technology used in the semiconductor production process, a large number of contactors can be aligned in a small space which is suitable for testing a large number of semiconductor devices at the same time.

Since the large number of probe contactors are produced at the same time on the substrate with the use of the microfabrication technology without involving manual handling, it is possible to achieve consistent quality, high reliability and long life in the contact performance. Further, because the probe contactors can be fabricated on the same substrate material as that of the device under test, it is possible to compensate the temperature expansion coefficient of the device under test, which is able to avoid positional errors.

BRIEF DESCRIPTION OF THE DRAWING

FIG. 3 is a bottom view showing an example of the probe card having an epoxy ring for mounting a plurality of cantilevers as probe contactors.

FIGS. 4A–4E are circuit diagrams showing equivalent circuits of the probe card of FIG. 3.

FIGS. 9A and 9C–9J are schematic cross sectional views showing a process for producing the contact structures of the present invention.

FIG. 9B is a top view of the substrate corresponding to the cross sectional view of FIG. 9A.

DETAILED DESCRIPTION OF THE PREFERRED EMBODIMENT

Figure 1:
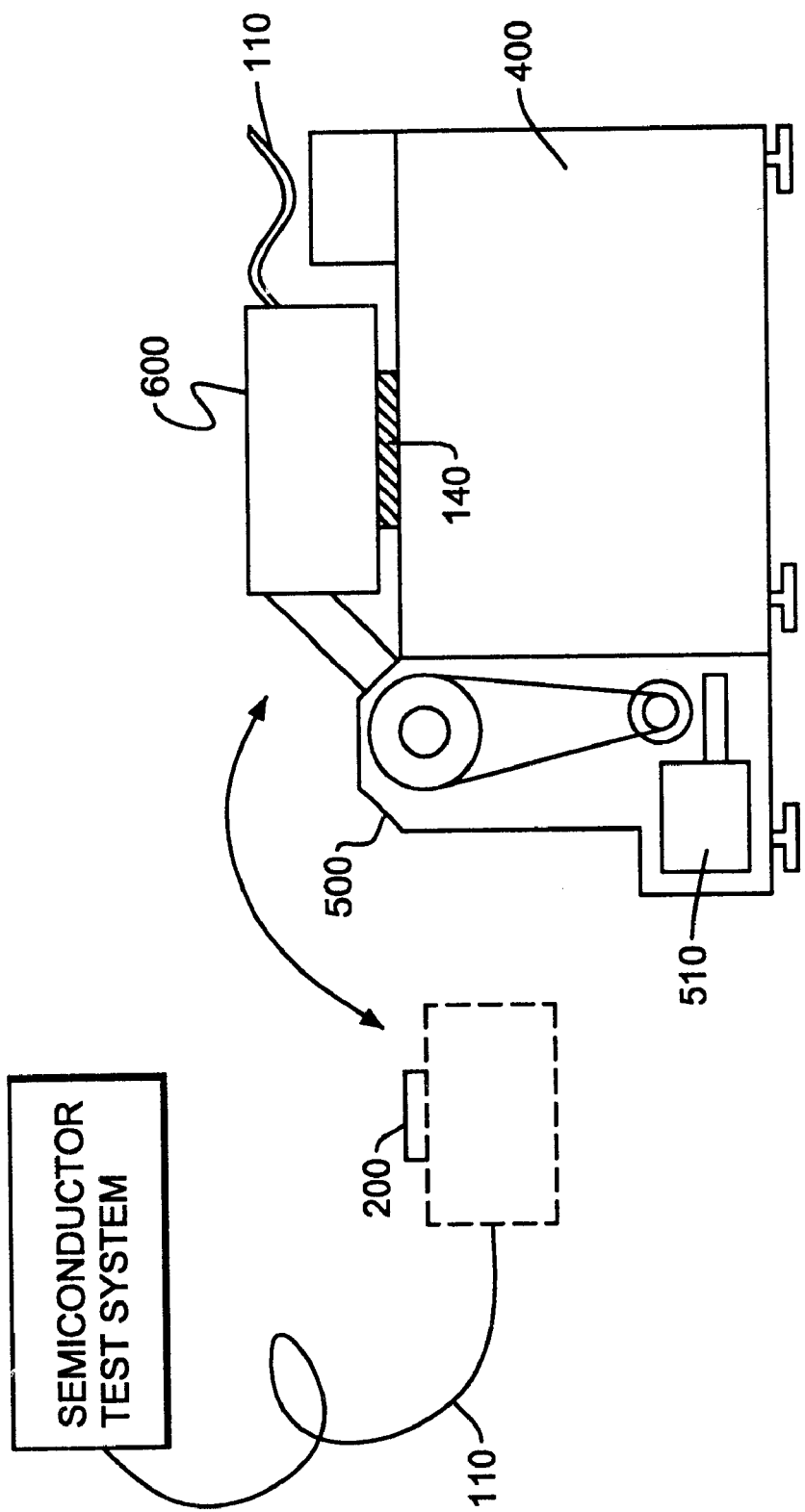
FIG. 1 is a schematic diagram showing a structural relationship between a substrate handler and a semiconductor test system having a test head.
Figure 2:
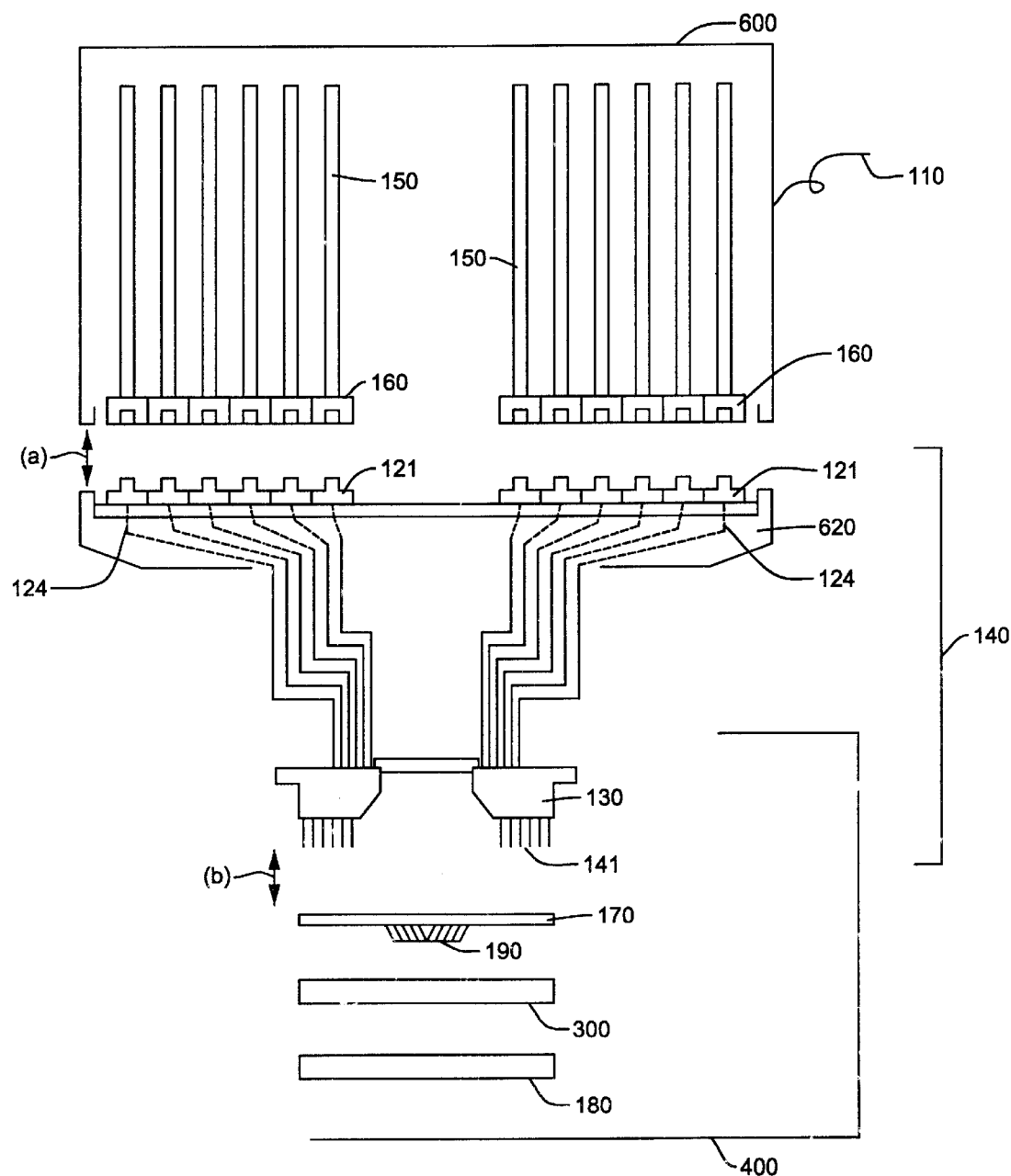
FIG. 2 is a schematic diagram showing an example of detailed structure for connecting the test head of the semiconductor test system to the substrate handler.
Figure 5:
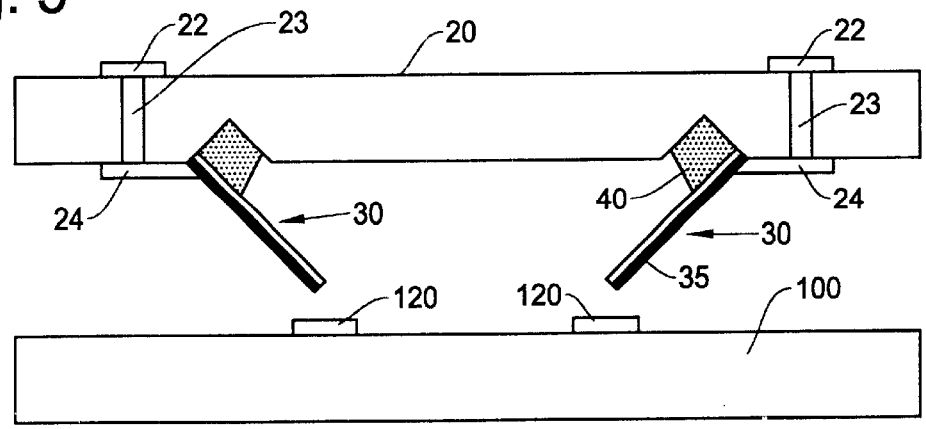
FIG. 5 is a cross sectional view showing a contact substrate mounting the contact structures of the present invention produced through a photolithography process and a semiconductor wafer having contact targets.

The contact structures of the present invention will be described with reference to FIGS. 5–15. FIG. 5 shows an example of contactor structures 30 of the present invention produced through a photolithography process and mounted on a contact substrate 20. The contact substrate 20 is so positioned over contact targets such as a semiconductor wafer 100 to be tested that the contact structures 30 establish electric contact with the semiconductor wafer 100 when pressed with each other. Although only two contact structures 30 are shown in FIG. 5, a large number of contactor structures 30 are aligned on the substrate 20 in an actual semiconductor wafer test.

Such a large number of contact structures are produced through the same photolithography process on a silicon substrate 40 as will be explained later. When the semiconductor wafer 100 under test moves upward, the contactors 30 contact with corresponding contact targets (electrodes) 120 on the wafer 100. The pitch between the pads 120 may be as small as 50 $\mu$m or less wherein the contact structures 30 can easily be aligned in the same pitch since they are made through the same semiconductor production process as the wafer 300 are made.

The contact structures 30 on the substrate 20 can be directly mounted on a probe card such as shown in FIG. 3, or molded in a package, such as a traditional IC package having leads, so that the package is mounted on a probe card, or interconnected with other substrate. Since the contact structures 30 can be fabricated in a very small size, an operable frequency range of a probe card mounting the contact structures of the present invention can be easily increased to 2 GHz or higher. Because of the small size, the number of contactors on a probe card can be increased to, for example 2,000, which is able to test as many as 32 or more memory devices in parallel at the same time.

Furthermore, because the contact structures 30 of the present invention are formed on the substrate 20, which is typically a silicon substrate, environmental changes such as a temperature expansion ratio of the silicon substrate are the same as those of the semiconductor wafer 100 under test. Therefore, the accurate positioning between the contact structures 30 and the contact targets 120 can be maintained throughout the test.

In FIG. 5, the contact structure 30 has a conductive layer 35 in a finger (beam) like shape. The contact structures also has a base 40 which is attached to the substrate 20. An interconnect trace 24 is connected to the conductive layer 35 at the bottom of the substrate 20. Such a connection between the interconnect trace 24 and the conductive layer 35 is made, for example, through a solder ball. The substrate 20 further includes a via hole 23 and an electrode 22. The electrode 22 is to interconnect the contact substrate 20 to an external structure such as a probe card or IC package through a wire or lead. Thus, when the semiconductor wafer 100 moves upward, the contact structure 30 and the contact target 120 on the wafer 100 mechanically and electrically contact with each other. Consequently, a signal path is established from the contact target 120 to the electrode 22 on the substrate 20. The interconnect trace 24, the via hole 23 and the electrode 22 also function to fan-out the small pitch of the contact structures 30 to a larger pitch to fit to the probe card or IC package.

Because of the spring force of the beam like shape of the contact structure 30, the end of the conductive layer 35 produces a sufficient contact force when the semiconductor wafer 100 is pressed against the substrate 20. The end of the conductive layer 35 is preferably sharpened to achieve a scrubbing effect when pressed against the contact target 120 achieving penetration through a metal-oxide layer. For example, if the target 120 on the wafer 100 has aluminum oxide on its surface, the scrubbing effect is necessary to establish the electric contact with low contact resistance. The spring force derived from the beam like shape of the contact structure 30 provides an appropriate contact force against the contact target 120. The elasticity produced by the spring force of the contact structure 30 also functions to compensate the differences in size or the fluctuation of flatness involved in the substrate 20, the contact target 120 and the wafer 100, as well as the contact structures 30.

An example of material of the conductive layer 35 includes nickel, aluminum, copper, nickel palladium, rhodium, nickel gold, iridium or several other depositable materials. An example of size of the contact structure 30 intended for a probe-test application may be 100–500 μm in overall height, 100–600 μm in horizontal length, and about 30–50 μm in width for the pitch of 50 μm or more between contact targets 120.

Figure 6:
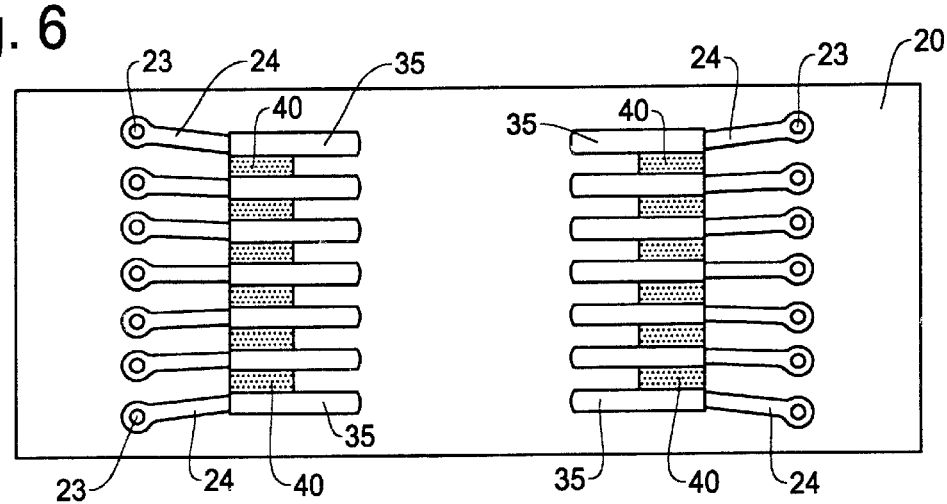
FIG. 6 is a schematic diagram showing a bottom view of the contact substrate of FIG. 5 having the contact structures of the present invention.

FIG. 6 is a bottom view of the contact substrate 20 of FIG. 5 having a plurality of contact structures 30. In an actual system, a larger number of contact structures, such as several hundreds of them, will be aligned in the manner shown in FIG. 6. Each set of the interconnect trace 24, the via hole 23 and the electrode 22 establishes a signal path from the tip of the conductive layer 35 as well as functions to fan-out the small pitch of the contact structures 30 to a larger pitch to fit to the probe card or IC package.

Figure 7:
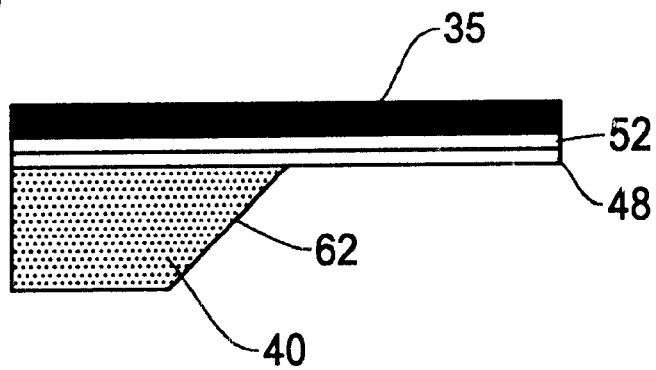
FIG. 7 is a schematic diagram showing a more detailed cross sectional view of one of the contact structures of the present invention.
Figure 8:
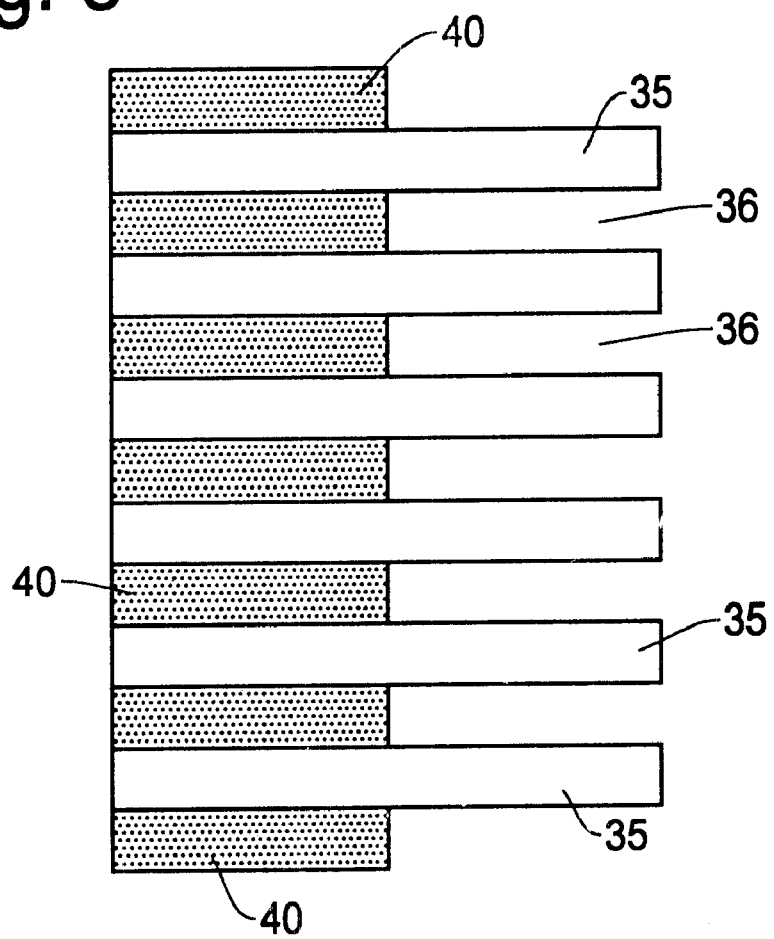
FIG. 8 is a schematic diagram showing a top view of the contact structures of FIG. 7.

FIGS. 7 and 8 show a more detailed view of the contact structure 30 of the present invention. In the cross sectional front view of FIG. 7, the contact structure 30 includes a silicon base 40, a boron doped layer 48, a insulation layer 52, and a conductive layer 35. The silicon base 40 has an angled support 62 to support the finger like portion of the contact structure 30. As will be explained later, the angled support 62 is produced through an anisotropic etching process in a specific crystalline. The boron doped layer 48 is to function as an etch stopper during the production process. The insulation layer 52 is typically a silicon dioxide layer to electrically insulate the conductive layer 35 from the other parts of the contact structure 30.

FIG. 8 is a top view of the contact structure of FIG. 7, wherein a plurality of conductive layers 35 are shown in a finger like shape. Between the two adjacent conductive layers 35, there is a free space 36 so that each finger (beam) portion of the contact structure is independent from the other and is moveable separately from the other. Such free spaces 36 are created through the etching process noted above by etching away the predetermined portions of the silicon substrate without the boron doped layer as will be further explained later.

FIGS. 9A–9J show an example of process for producing the contact structures 30 of the present invention through the photolithography technology. In this example, a large number of pairs of contact structures are formed on a silicon substrate, and each pair of the contact structures are separated from each other in a later stage.

In FIG. 9A, a photo resist layer 42 is provided on a silicon substrate 40. The photo resist layer 42 is to create a boron doped layer on the silicon substrate 40. Although not shown, a photo mask is aligned over the silicon substrate so that the photo resist layer 42 be exposed with ultraviolet light. Thus, a pattern such as shown in FIG. 9B which is a top view of FIG. 9A is created in which specified portions 43 show cured photo resist resulted from the exposure to the ultraviolet light. The unexposed part of the resist 42 can be dissolved and washed away, leaving the specified portions 43 on the silicon substrate 40.

Figure 9C:
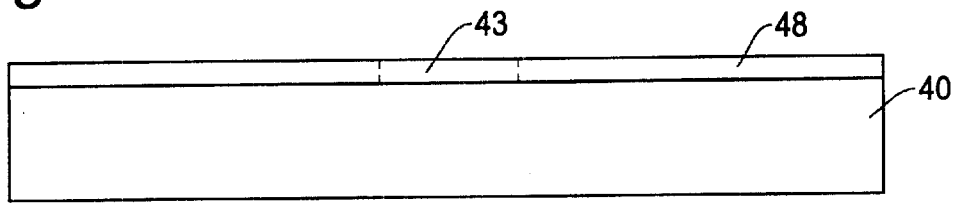

An etch stop agent, such as boron is doped in the upper surface of the silicon substrate having the cured photo resist at the specified portions 43. Because of the photo resist, the specified portions 43 of the silicon substrate 40 are not doped with the boron. Thus, after removing the photo resist in the portions 43, a boron doped layer 48 is created as shown in FIG. 9C in which the boron is doped in a thin layer over the silicon substrate except in the specified areas 43. The silicon substrate in the specified areas 43 without the boron will be etched away in an anisotropic etching process as will be described later.

Figure 9D:
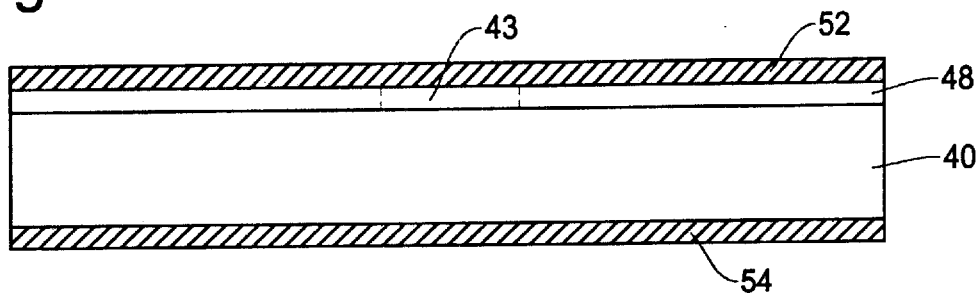
Figure 9E:
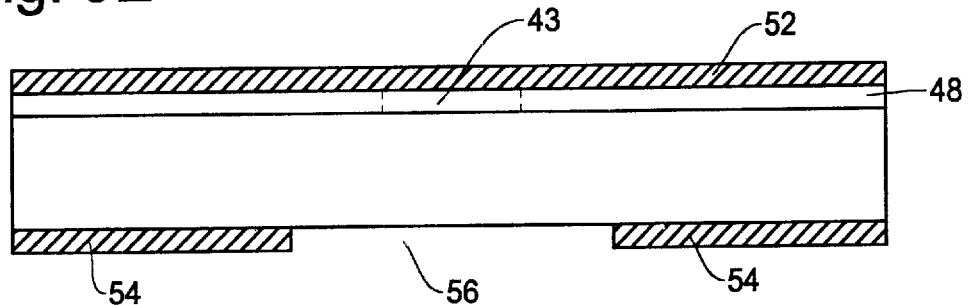

In FIG. 9D, silicon dioxide ($SiO_2$) layers 52 and 54 are produced on the upper surface and bottom surface of the silicon substrate 40. The silicon dioxide layer 52 is to function as an insulator when a conductive layer 35 (such as shown in FIG. 7) is created. Other dielectric material can also be feasible for this layer. The silicon dioxide layer 54 at the bottom surface of the silicon substrate 40 is to function as an etching mask as in FIG. 9E. The silicon dioxide layer 54 is removed through a photolithography process to define an etching area 56. In this example, the etching area 56 is formed at about the center of the bottom of the silicon substrate 40.

Figure 9F:
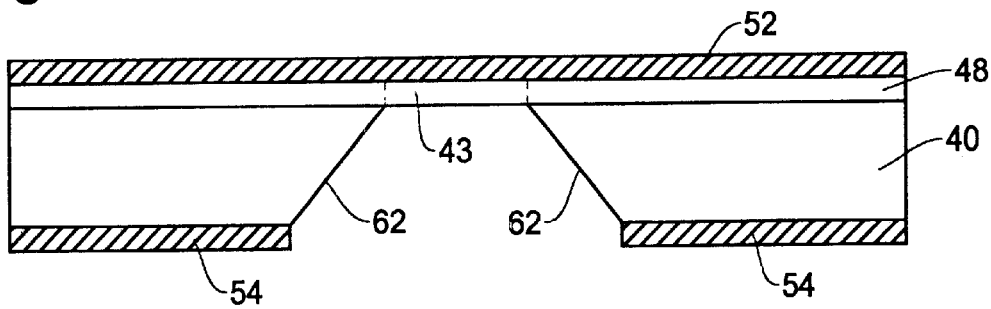

In FIG. 9F, an anisotropic etching process is performed for the silicon substrate 40. As is known in the art, in the case where the silicon substrate 40 is cut in a (100) crystal plane, a V-shaped groove is formed through the anisotropic etching when etchant is provided at the etching area 56. The angle of the groove is 54.7° relative to the bottom surface of the silicon substrate 40. The groove angle is the same as a (111) crystal plane of the silicon substrate 40. Examples of etchant for this purpose include EDP (ethylene diamine pyrocatechol), TMAH (tetra methyl ammonium hydroxide) and KOH (potassium hydroxide).

As a result of the anisotropic etching process, as shown in FIG. 9F, the angled support 62 is created whose size is dependent upon the size of the etching area (etch window) 56 and a time length of the etching process. Because of the boron doped layer 48, the etch is stopped at the boron layer 48 while the specified areas 43 without boron are etched away, resulting in the spaces 36 of FIG. 8 when the beam portions are cut into half as will be described later. Because of the spaces 36, each of the contact structures 30 are physically separated from one another.

Figure 9G:
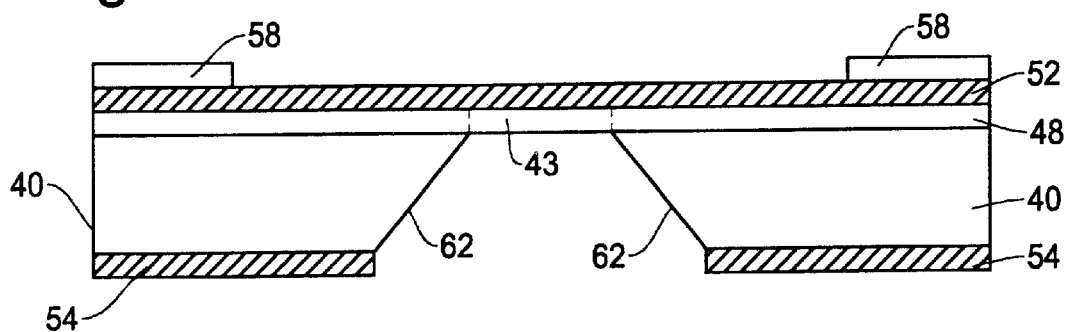
Figure 9H:
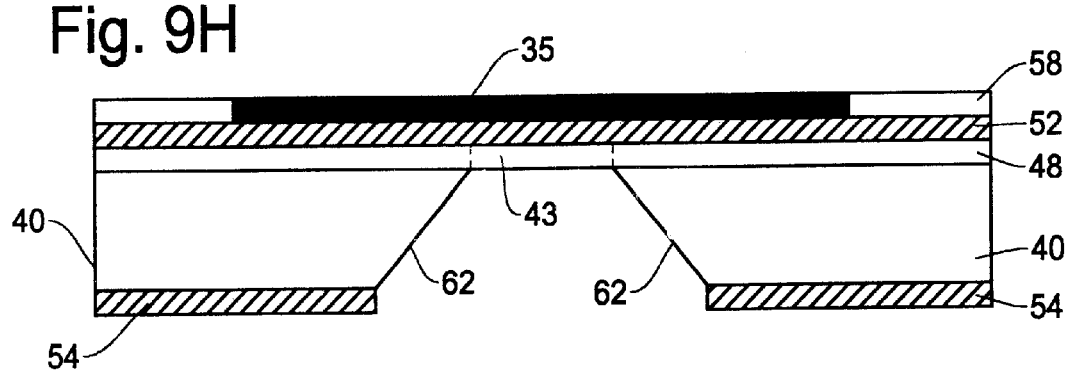
Figure 9I:
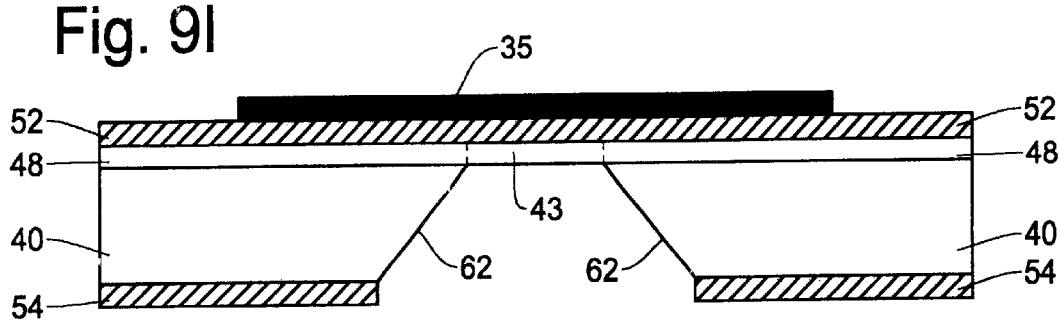
Figure 9J:
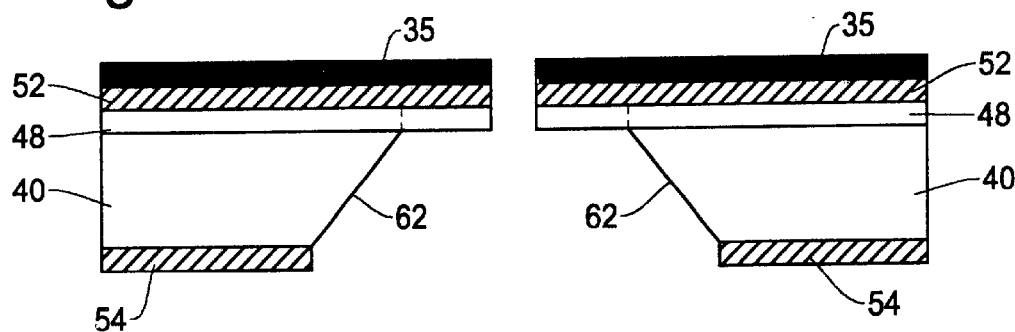

In FIG. 9G, a plating seed layer (not shown) is formed on the silicon dioxide layer 52. A further photolithography process is performed on the silicon substrate to create a photo resist pattern for forming conductive layer 35. The cured photo resist 58 resulted from this photolithography process is shown in FIG. 9G. A plating process is carried out to produce the conductive layer 35 as shown in FIG. 9H. An example of material in the conductive layer 35 includes nickel, aluminum and copper. Alternatively, a variety of deposition techniques can be used in producing the conductive layer 35 including vacuum evaporation, cathode sputtering, vapor-phase deposition. The photo resist 58 is removed in FIG. 9I. Finally, the silicon substrate 40 is cut into half at the center thereof (beam portions) as shown in FIG. 9J. Unwanted portions at both ends of the silicon substrate 40 may also be cut out.

Figure 10A:
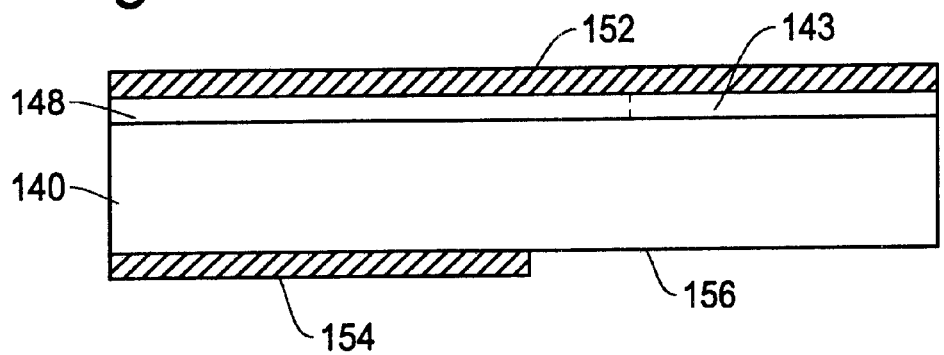
FIGS. 10A–10C are schematic cross sectional views showing another process for producing the contact structures of the present invention.
Figure 10B:
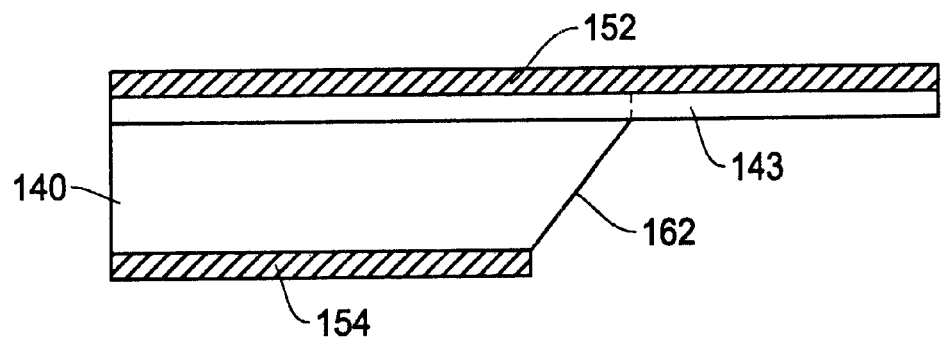
Figure 10C:
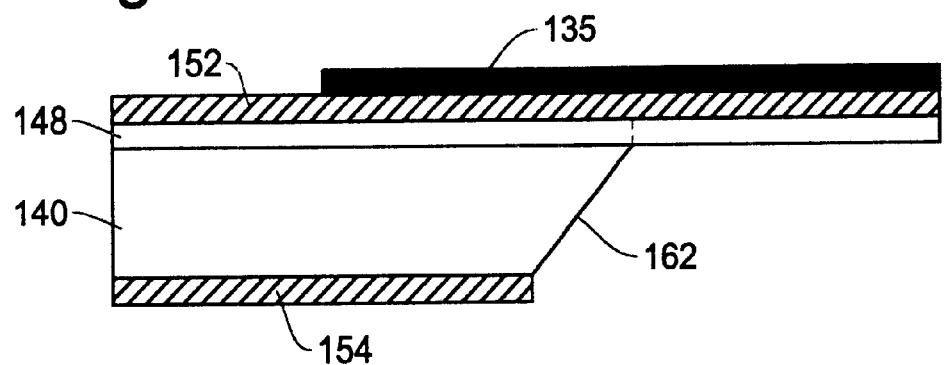

FIGS. 10A–10C show another example of process for producing the contact structures 30 of the present invention through the photolithography technology. Unlike the example of FIGS. 9A–9J in which a large number of pairs of contact structures are integrally created and separated from one another at the last stage, a large number of separate contact structures are formed at the edge of the silicon substrate.

In FIG. 10A, a boron doped layer 148 is formed on the silicon substrate 140 wherein there defined specified (etch-out) areas 143 which are not doped with boron. A dielectric layer 152 such as silicon dioxide SiO$_2$ is provided on the boron doped layer 148 to establish as an insulator. A silicon dioxide SiO$_2$ layer 154 is also provided at the bottom of the silicon substrate 140 as an etch mask. An etch window 156 is defined by a photolithography process (not shown) for allowing an anisotropic etch therethrough as noted above.

The anisotropic etch process is performed on the silicon substrate 140 which creates an angled portion along with the (111) crystal plane of the silicon substrate 140 as in FIG. 10B. As noted above, this angle is 54.7° with respect to the bottom surface of silicon substrate 140. Because the specified portions 143 are not doped with boron, the silicon substrate in these areas are etched away, leaving the finger (comb) like structure in a plan view at the right end of FIG. 10B.

In FIG. 10C, a further photolithography process is performed to form a photo resist layer (not shown) and a conductive layer 135 is created through a plating process. The resultant contact structures 30 are cut into an appropriate shape such as shown in FIG. 7.

Figure 11A:
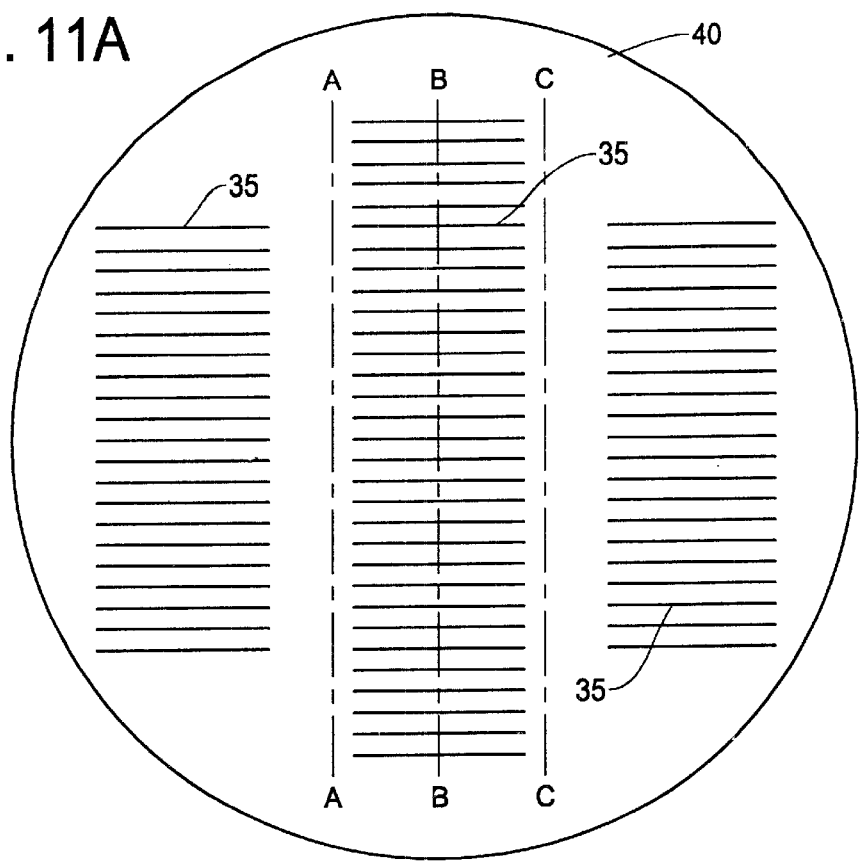
FIG. 11 is a top view of a silicon wafer for producing a large number of contact structures of the resent invention at the same time.
Figure 11B:
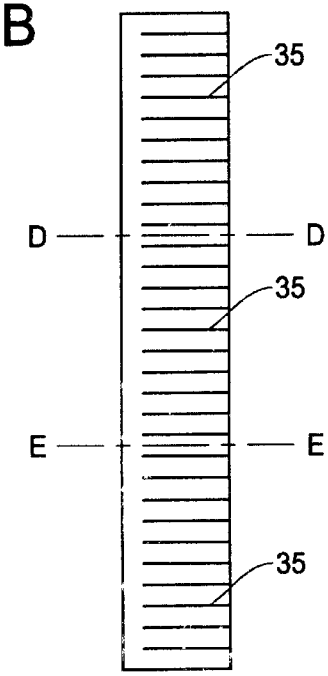
Figure 11C:
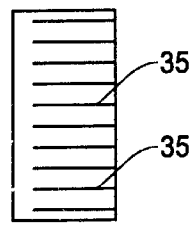

FIGS. 11A–11C are schematic diagrams showing an example of process for producing a large number of contact structures on a silicon substrate 40. The photolithography process shown in FIGS. 9A–9J creates a large number of contact structures shown by conductive beams 35 on the silicon substrate 40 in FIG. 11A. The silicon substrate 40 is cut out in a dicing or etching process at lines A—A, B—B and C—C, for example. The resultant contact structures shown in FIG. 11B may further be cut into smaller units, if necessary, at D—D and E—E lines if the number of conductive beams 35 need to be small in an intended application as shown in FIG. 11C.

Figure 12A:
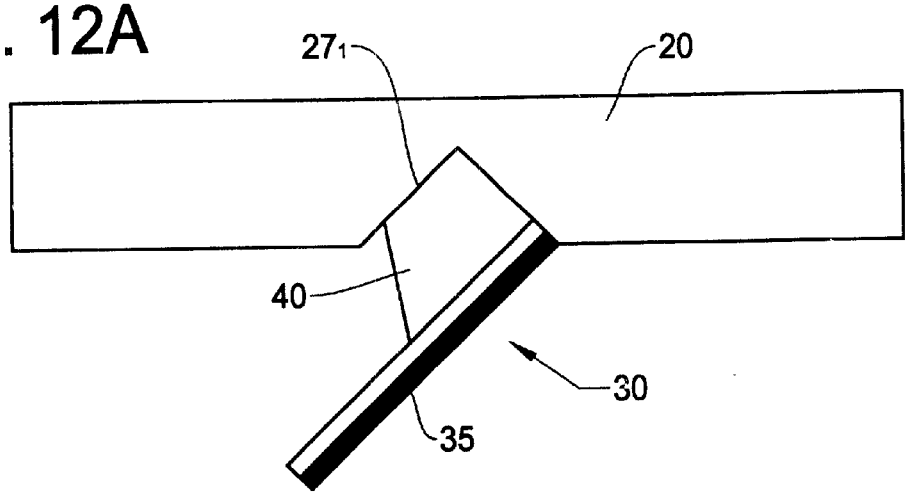
FIGS. 12A and 12B are schematic cross sectional views showing examples of method for assembling the contact structures of the present invention in the contact substrate.
Figure 12B:
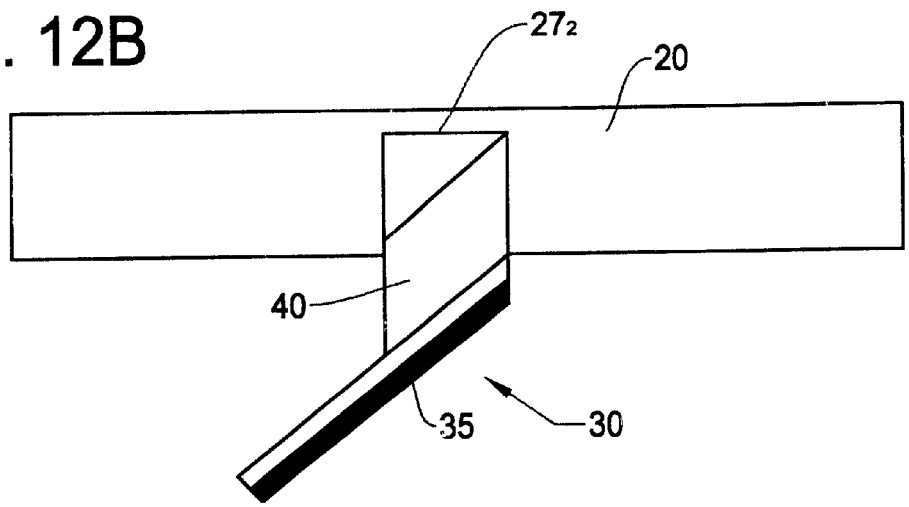

FIGS. 12A and 12B are schematic cross sectional views showing examples of method for assembling the contact structures of the present invention in the contact substrate. An example of material of the contact substrate 20 includes silicon and ceramic. In case where the substrate is made of silicon, grooves 27 or 27, for mounting the contact structures 30 may be formed through an anisotropic etching or other etching processes. Further, when the contact substrate is made of silicon, it has an advantage in that the temperature expansion of the contact substrate can compensate a semiconductor wafer under test. A ceramic substrate has a mechanical strength and physical stability superior to the silicon substrate. The silicon base 40 of the contact structure is inserted in the grooves provided on the contact substrate 20 and fixed therein with use of, for example, an adhesive or epoxy resin.

Figure 13A:
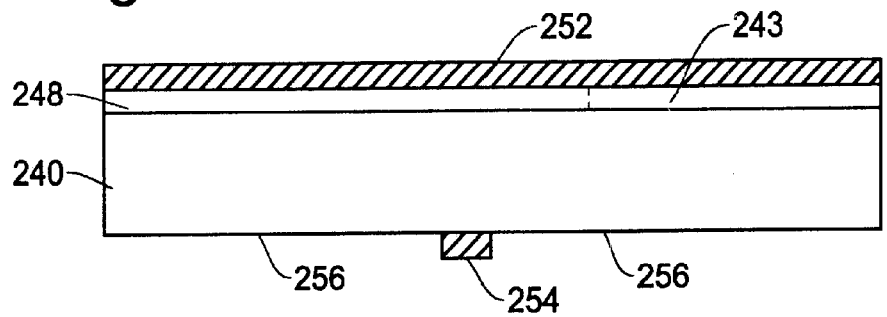
FIGS. 13A–13D are schematic cross sectional views showing a further example of process for producing the contact structures of the present invention.
Figure 13B:
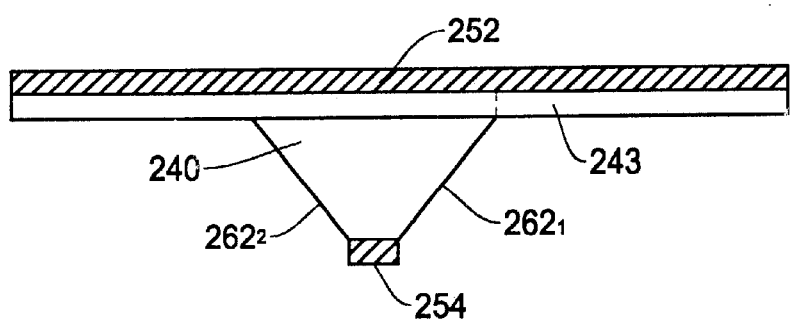
Figure 13C:
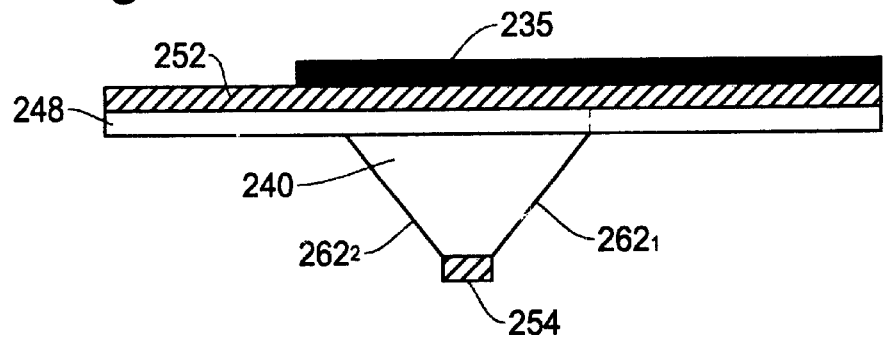
Figure 13D:
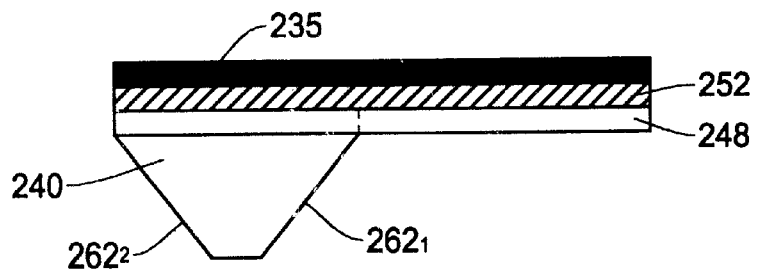
Figure 14:
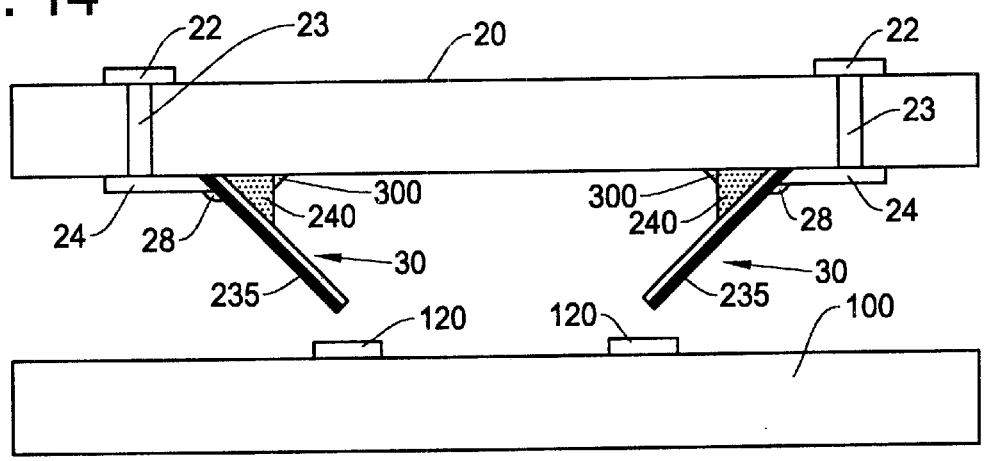
FIG. 14 is a cross sectional view showing a contact substrate mounting the contact structures produced through a photolithography process of FIGS. 13A–13D and a semiconductor wafer having contact targets.

FIGS. 13A–13D are schematic cross sectional views showing a further example of process for producing the contact structures of the present invention. In this process, a contact structure shown in FIG. 13D is produced which has two inclined portions 262$_1$ and 262$_2$ on the base of the contact structure. The inclined portion 262$_2$ is used to mount the contact structure on a planar surface of a contact base as shown in FIG. 14 as will be explained later.

In FIG. 13A, a boron doped layer 248 is formed on the silicon substrate 240 wherein specific (etch-out) areas 243 are defined which are not doped with boron. A dielectric layer 252 such as silicon dioxide SiO$_2$ is provided on the boron doped layer 248 to establish as an insulation layer. A silicon dioxide SiO$_2$ layer 254 is also provided at the bottom of the silicon substrate 140 as an etch mask. An etch windows 256 are defined by a photolithography process (not shown) for allowing an anisotropic etch therethrough as noted above.

The anisotropic etch process is performed on the silicon substrate 240 which creates angled portions 262$_1$ and 262$_2$ along with the (111) crystal plane of the silicon substrate 240 as in FIG. 13B. As noted above, this angle is 54.7° with respect to the bottom surface of silicon substrate 240. Alternatively, the inclined portion 262$_2$ can be made by dicing the silicon substrate 240 rather than the etching process noted above. Because the specified portions 243 are not doped with boron, the silicon substrate in these areas are etched away, leaving the finger (comb) like structure in a plan view at the right end of FIG. 13B.

In FIG. 13C, a further photolithography process is performed to form a photo resist layer (not shown) so that a conductive layer 235 is created through a plating process. The resultant contact structures 30 are cut into an appropriate shape such as shown in FIG. 13D.

FIG. 14 is a cross sectional view showing a contact substrate mounting the contact structures produced through a photolithography process of FIGS. 13A–13D and a semiconductor wafer having contact targets. Unlike the examples of FIGS. 5 and 12, the contact structures 30 in this example are mounted on a flat surface of the contact substrate 20. Namely, the inclined portion $262_2$ on the silicon substrate 240 shown in FIG. 13D meets the flat surface of the contact substrate 20. The contact structures 30 are fixed to the planar surface at the bottom of the contact substrate 20 with adhesives 300 such as high temperature adhesives.

In the example of FIG. 14, similar to FIG. 5, an interconnect trace 24 is connected to the conductive layer 235 at the bottom of the substrate 20. Such a connection between the interconnect trace 24 and the conductive layer 235 is made, for example, through a solder ball 28. The substrate 20 further includes a via hole 23 and an electrode 22. The electrode 22 is to interconnect the contact substrate 20 to an external structure such as a probe card or IC package through a wire or lead. Thus, when the semiconductor wafer 100 moves upward, the contact structure 30 and the contact target 120 on the wafer 100 mechanically and electrically contact with each other. Consequently, a signal path is established from the contact target 120 to the electrode 22 on the substrate 20. The interconnect trace 24, the via hole 23 and the electrode 22 also function to fan-out the small pitch of the contact structures 30 to a larger pitch to fit to the probe card or IC package.

Figure 15:
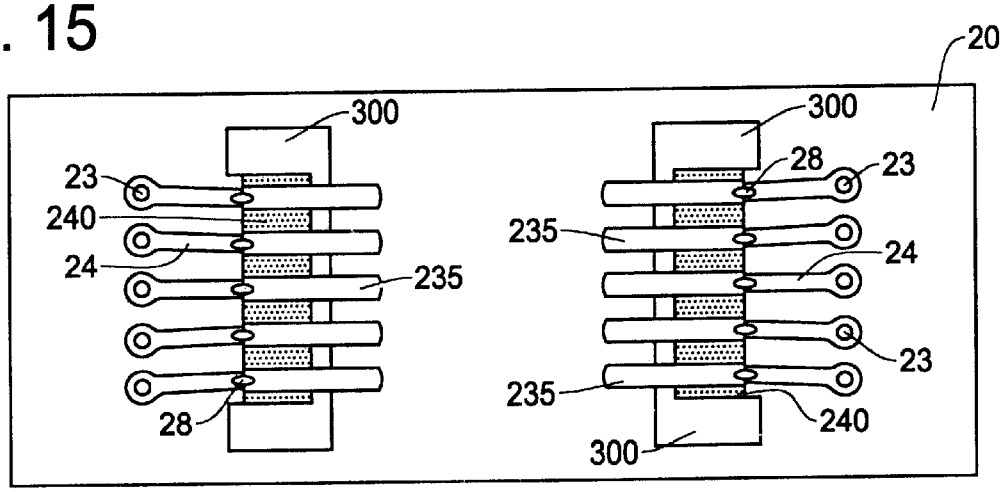
FIG. 15 is a schematic diagram showing a bottom view of the contact substrate of FIG. 14 having the contact structures of the present invention.

FIG. 15 is a schematic diagram showing a bottom view of the contact substrate of FIG. 14 having the contact structures of the present invention. In this example, the adhesives 300 are used to bond the contact structures 30 to the contact base 20 at both sides of the set of the contact structures 30 as well as the corners shown in FIG. 14.

According to the present invention, the contact structure has a very high frequency bandwidth to meet the test requirements of next generation semiconductor technology. Since the probe contactor is formed through a modern miniaturization technology used in the semiconductor production process, a large number of contactors can be aligned in a small space which is suitable for testing a large number of semiconductor devices at the same time.

Since the large number of contact structures are produced at the same time on the substrate with the use of the microfabrication technology without involving manual handling, it is possible to achieve consistent quality, high reliability and long life in the contact performance. Further, because the contact structures can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for testing a semiconductor wafer, a packaged LSI or a printed circuit board (device under test), comprising:

a plurality of contact beams each of which exhibits a spring force in a transversal direction thereof to establish a contact force when the tip of each contact beam pressed against a contact target, each of said contact beams comprising:
a silicon base having an inclined support portion created through an anisotropic etching process;
an insulation layer having a planar shape for electrically insulating a beam portion from one another; and
a conductive layer having a planar shape and made of conductive material formed on one surface of the insulation layer so that said beam portion is created by the insulation layer and the conductive layer;
wherein the insulation layer and the conductive layer have substantially the same length;

a contact substrate for mounting said plurality of contact beams, said contact substrate having grooves for receiving said silicon base therein in a manner to fix said contact beam in a diagonal direction; and a plurality of contact traces provided on a surface of said contact substrate and respectively connected to said contact beams.

2. A contact structure as defined in claim 1, wherein said contact substrate is made of silicon.

3. A contact structure as defined in claim 1, wherein said contact substrate is made of ceramic.

4. A contact structure as defined in claim 1, further comprising:

a plurality of via holes on said contact substrate and connected to said plurality of contact traces for establishing electrical connection between an upper surface and a bottom surface of said contact substrate; and a plurality of electrodes connected to said plurality of via holes for establishing electrical connections to said electrical component external to said contact substrate.

5. A contact structure as defined in claim 1, further comprising a boron doped layer between said silicon base and said insulation layer.

6. A contact structure as defined in claim 1, wherein said conductive layer is made of conductive metal and formed through a plating process.

7. A contact structure as defined in claim 1, wherein said insulation layer is made of silicon dioxide.

* * * * *